(12) United States Patent
Khalid et al.

(10) Patent No.: US 10,651,859 B2
(45) Date of Patent: May 12, 2020

(54) RADAR DEVICE, RADAR SYSTEM AND METHOD FOR GENERATING A SAMPLING CLOCK SIGNAL

(71) Applicant: Infineon Technologies AG, Neubiberg (DE)

(72) Inventors: Farhan Bin Khalid, München (DE); Herbert Jaeger, Linz (AT); Dian Tresna Nugraha, München (DE); Andre Roger, München (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/276,696

(22) Filed: Feb. 15, 2019

(65) Prior Publication Data

US 2019/0273502 A1 Sep. 5, 2019

(30) Foreign Application Priority Data

Mar. 5, 2018 (DE) .................. 10 2018 105 018

(51) Int. Cl.
| | | |
|---|---|---|
| *H03L 7/091* | (2006.01) | |
| *G01S 7/28* | (2006.01) | |
| *G01S 13/931* | (2020.01) | |
| *H04L 7/033* | (2006.01) | |

(52) U.S. Cl.
CPC ............ *H03L 7/091* (2013.01); *G01S 7/2806* (2013.01); *G01S 13/931* (2013.01); *H04L 7/0331* (2013.01)

(58) Field of Classification Search
CPC ..... H03L 7/091; G01S 7/2806; G01S 13/931; H04L 7/0331
USPC ......................................................... 375/355
See application file for complete search history.

(56) References Cited

U.S. PATENT DOCUMENTS

| | | | |
|---|---|---|---|
| 9,793,910 B1 * | 10/2017 | Devarajan | ........... H03M 1/0634 |
| 2015/0153445 A1 | 6/2015 | Jansen | |
| 2016/0294591 A1 | 10/2016 | Kurchuk et al. | |

FOREIGN PATENT DOCUMENTS

DE 102016210771 10/2017

* cited by examiner

*Primary Examiner* — Michael R Neff
(74) *Attorney, Agent, or Firm* — Harrity & Harrity, LLP

(57) ABSTRACT

A radar device comprises a data communication input interface configured to receive a data clock signal for a data bus and an analog to digital converter configured to sample a signal at time instants given by a sampling clock signal. In an implementation, a sampling clock generation circuit is configured to generate the sampling clock signal based on the data clock signal.

20 Claims, 9 Drawing Sheets

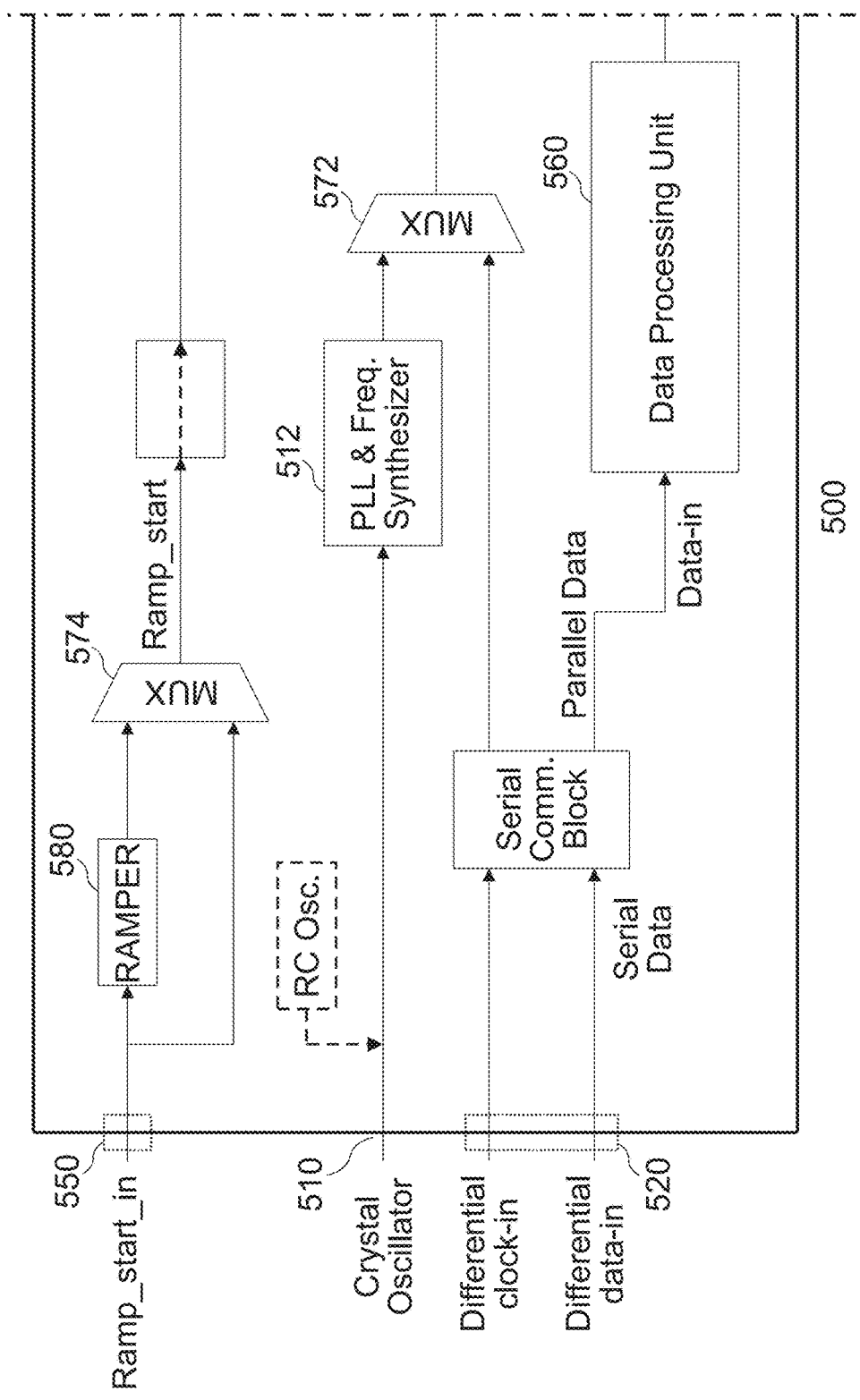

RADAR DEVICE, RADAR SYSTEM AND METHOD FOR GENERATING A SAMPLING CLOCK SIGNAL

RELATED APPLICATION

This application claims priority under 35 U.S.C. § 119 to German Patent Application No. 102018105018.6, filed on Mar. 5, 2018, the contents of which are incorporated by reference herein in their entirety.

FIELD

Implementations described herein relate to radar devices and to methods for generating a sampling clock signal.

BACKGROUND

To process radar signals, for example within vehicles, several radar devices may cooperate to determine and process a radar signal reflected from a target. Increasing the number of radar devices which cooperate to process a reflected radar signal may increase the spatial resolution of the system, for example an azimuthal and elevational resolution with which the target is determined relative to the radar devices. A single radar device of, for example, an automotive radar system, typically comprises a transmit chain to generate the radar signal to be sent and a receive chain to receive and process the reflected radar signal. The transmit chain comprises an oscillator circuit to generate the radar signal and a power amplifier to amplify the radar signal. Typical frequencies of local oscillator signals may, for example, be 38 GHz and 77 Ghz. The power amplifier is coupled to one or more transmit antennas which radiate the radar signal into the environment. The reflected radar signal is received by an array of receive antennas operating as a phased array. The reflected radar signal received by a single antenna is amplified by a low noise amplifier before being further processed. In a continuous wave radar device, the oscillator circuit generates a local oscillator signal which exhibits a time varying frequency, for example increasing or decreasing linearly in a ramp like manner. The oscillator signal is used to generate the radar signal to be sent as well as to downmix the received radar signal into a downconverted radar signal using a mixer circuit. A downconverted radar signal may also be referred to as a baseband signal.

The frequency of the downconverted radar signal so correlates to the time difference between sending and receiving the radar signal and, hence, to the distance of a reflecting object. Within the radar device, the downconverted radar signal of each antenna is typically digitized by means of an analog to digital converter (ADC) and the digitized downconverted radar signals are further processed to, for example, combine the downconverted radar signals of all receive antennas to determine an azimuth and an elevation estimate for each reflecting target within a field of view of the radar device. The location may so be determined relative to the radar device and, for example, given by two angles (elevation and azimuth) and a distance. In order to operate as a phased array, downmixing and sampling of the radar signals received by all antennas of the array of an individual radar device is performed synchronously.

In order to enable cooperative processing of several radar devices, it may be required to also synchronize the processing of the signals received by means of the antennas of the different radar devices. In particular, it may be of importance to sample the signal received by all antennas of the cooperating radar devices at the same time instant in order to, for example, determine the location of a radar reflecting target without an error.

In order to achieve such synchronicity, a sampling clock signal can be distributed synchronously to all the analog to digital converters of the cooperating radar devices to define the time instants at which each analog-to-digital converter samples the signal of the antennas in an individual radar device. In order to guarantee synchronous arrival of the sampling clock signal at each radar device and its analog-to-digital converters in such an approach, high effort may be required in, for example, routing the sampling clock signal between a generator of the sampling clock signal and each individual radar device so that no propagation time differences occur on the different routes to the individual cooperating radar devices. Routing constraints might also limit the flexibility in setting up a radar system in that it may be infeasible to extend the number of cooperating radar devices on a given printed circuit board if no more space for appropriate routing is available.

SUMMARY

It may be desirable to achieve synchronized processing or sampling of signals with reduced effort.

An implementation of a radar device comprises a data communication input interface configured to receive a data clock signal for a data bus and an analog to digital converter configured to sample a signal at time instants given by a sampling clock signal. A sampling clock generation circuit is configured to generate the sampling clock signal based on the data clock signal. According to the implementation, the sampling clock signal used for operating the analog-to-digital converter is derived from a data clock signal already present to enable operation of the data bus. By generating the sampling clock signal within the radar device, one may save on additional input pins which would otherwise be required to receive an external clocking signal. In radar systems having, for example, two or more radar devices communicating with each other by means of a data bus, coordinated sampling by the respective analog-to-digital converters may so be achieved without requiring additional conductive paths between the radar devices. Further, one may gain flexibility in designing the radar systems since once the capability to derive sampling clock signals from a data clock signal exists, no effort is to be spent to guarantee that signal propagation times along any of the interconnecting conductive paths need to be identical.

In a further implementation, the sampling clock generation circuit comprises a frequency divider circuit configured to reduce a frequency of the data clock signal. Using a frequency divider circuit may allow to efficiently generate the sampling clock signal based on a data clock signal having a higher frequency. The sampling clock signal may be generated with high time resolution and low jitter given that it is based on a higher frequency data clock signal with intrinsically lower jitter.

In a further implementation, the sampling clock generation circuit is further configured to modify a phase of the sampling clock signal. If the sampling clock generation circuit furthermore modifies the phase of the sampling clock signal, synchronicity between sampling clock signals of different radar devices may be achieved by appropriate phase adjustment of the individual sampling clock signals. In some implementations, the phase of the sampling clock signal can be modified with a higher time resolution than the one given by integer multiples of the cycle time of the data clock signal which may allow to generate highly synchronized sampling clock signals amongst the different radar devices.

In a further implementation, the sampling clock generation circuit is configured to modify the phase based on at least one environmental parameter. By modifying the phase adjustment of the sampling clock signal based on environmental parameters, the overall time resolution and stability of the synchronization of the system may be further enhanced by considering change of environmental parameters that might affect the processing or signal propagation times within the radar devices or within signal lines interconnecting the radar devices. An environmental parameter to be considered may be any physical quantity that is determined in the radar device itself or in its periphery. The environmental parameter may be determined in the periphery of the radar device if a change of the physical quantity at the position of measurement correlates to the change of the physical quantity within the radar device. For example, temperature changes or pressure changes in the periphery of the radar device may be considered as well as strain variations within a semiconductor substrate of the radar devices.

In a further implementation, the sampling clock generation circuit is configured to synchronize the sampling clock signal to a predetermined cycle of the data clock signal. In synchronizing to a predetermined cycle of the data clock signal rather than to an arbitrary one, simultaneous processing may be achieved with high efficiency since every cooperating radar device is only required to hold information on which cycle of the data clock signal to synchronize to be able to operate synchronous to further radar devices.

In a further implementation, the sampling clock generation circuit is configured to perform the synchronization of the sampling clock signal to the predetermined cycle of the data clock signal upon receipt of a ramp start signal. If a ramp start signal is used to indicate the start of synchronized processing, a radar device may be used to trigger synchronized processing once it is guaranteed that a suitable data clock signal is present or, e.g., provided by the same radar device.

In a further implementation, the sampling clock generation circuit is configured to determine the predetermined cycle of the data clock signal by selecting the n'th cycle of the data clock signal after the receipt of the ramp start signal. Selecting the predetermined cycle by simply skipping a known number of cycles of the data clock signal after the occurrence of the ramp start signal may allow for a robust and simple implementation of the generation of the sampling clock signal using, for example, a counter.

In a further implementation, the analog to digital converter is configured to sample a downconverted radar signal of a receiver of the radar device, which may allow to operate the receive antennas of different collaborating radar devices as a phased array.

A further implementation of a radar device further comprises one or more of a mixer circuit configured to down-mix a received radar signal with a local oscillator signal to generate the downconverted radar signal, a receive antenna coupled to the downconverter and configured to receive the received radar signal and a low noise amplifier coupled between the receive antenna and the downconverter.

In a further implementation, the data communication input interface is further configured to receive payload data via the data bus, which may allow distributed processing of received radar signals. For example, the radar signal received by each radar device may be preprocessed within the radar device itself and forwarded to a subsequent radar device which is capable to receive it via its data communication input interface.

In a further implementation, the data communication input interface is configured to receive the data clock signal via the data bus which may result in a reduction of data pins on each radar device.

In a further implementation, the frequency of the data clock signal is at least twice a frequency of the sampling clock signal.

An implementation of a radar device comprises an oscillator interface configured to receive an oscillator signal generated by an external oscillator and a data clock generation circuit configured to generate a data clock signal for a data bus based on the oscillator signal. A data communication output interface is configured to output the data clock signal. Using an oscillator signal from an external oscillator to determine the data clock signal may result in a high precision data clock signal which may allow to use the so determined data clock signal as a source for sampling clock signals used to achieve synchronized processing while a less precise data clock signal may else be sufficient for the operation of the data bus itself.

In a further implementation, the radar device further comprises a sampling clock generation circuit configured to generate a sampling clock signal for an analog to digital converter based on the data clock signal which may allow the radar device to also process radar signals in addition to the functionality to provide an appropriate data clock signal.

In a further implementation, the data communication output interface is further configured to output payload data to enable to communicate preprocessed radar data to, e.g., another radar device.

In a further implementation, the radar device further comprises an analog to digital converter configured to sample a signal at time instants given by the sampling clock signal.

An implementation of a radar system comprises a first radar device, which comprises an oscillator interface configured to receive an oscillator signal, a data clock generation circuit configured to generate a data clock signal for a data bus based on the oscillator signal, and a data communication output interface configured to output the data clock signal. A second radar device of the radar system comprises a data communication input interface configured to receive the data clock signal, an analog to digital converter configured to sample a signal according to a sampling clock signal, and a sampling clock generation circuit configured to generate the sampling clock signal based on the data clock signal. A data bus connects the data communication output interface and the data communication input interface.

A further implementation of a radar system further comprises an oscillator circuit coupled to the oscillator interface of the first radar device, the oscillator circuit being configured to generate the oscillator signal. Using an oscillator circuit allows to generate the data clock signal with appropriate accuracy and to choose different oscillator circuits with, for example, different frequencies, depending on the frequency and/or accuracy requirements.

A further implementation of a radar system further comprises a common printed circuit board on which the first and second radar devices are mounted. Mounting the collaborating radar devices on a common printed circuit board may allow to easily design a radar system as a compact unit while avoiding complicated routing of separate data lines used to synchronize the processing within the radar devices.

A further implementation of a radar system further comprises a third radar device, comprising a data communication input interface configured to receive the data clock signal from the second radar device; an analog to digital converter configured to sample a further signal according to a further sampling clock signal; and a sampling clock generation circuit configured to generate the further sampling clock signal based on the data clock signal. Receiving the data clock signal from the second radar device, which itself received the signal from the generating first radar device, may allow to efficiently increase the number of collaborating radar devices by adding further devices in series to the already existing devices in a circular topology of the radar system.

A further implementation of a radar system further comprises a third radar device comprising a data communication input interface configured to receive the data clock signal from the first radar device; an analog to digital converter configured to sample a further signal according to a further sampling clock signal; and a sampling clock generation circuit configured to generate the further sampling clock signal based on the data clock signal. Receiving the data clock signal from the first radar device which generated the data clock signal may allow to reduce the delay times within the collaborating radar devices within a star topology of the radar system.

An implementation of an apparatus for generating a sampling clock signal for an analog to digital converter in a radar device comprises means for receiving a data clock signal for a data bus and means for generating the sampling clock signal based on the data clock signal.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
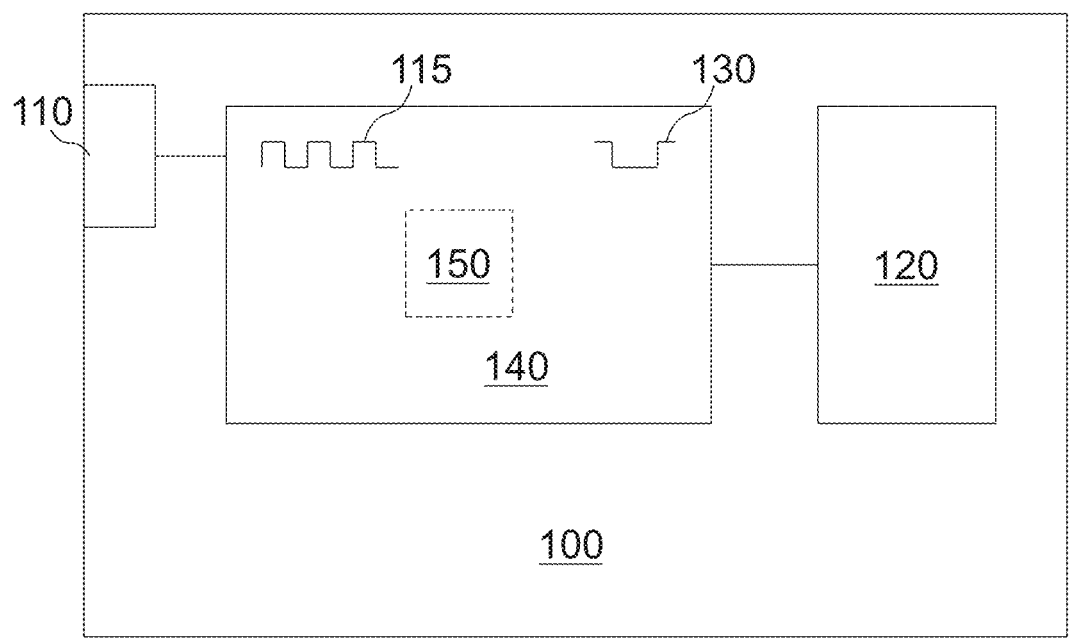
FIG. 1 illustrates an implementation of a radar device.

FIG. 1 illustrates an example of a radar device 100. The radar device 100 comprises a data communication input interface 110 configured to receive a data clock signal 115 for a data bus. The data clock signal 115 for the data bus may provide a time basis for payload data submitted on the data bus to, for example, be able to sample the signal on the data bus at time instants given by the data clock signal. The data clock signal 115 may be provided by means of a data communication input interface 110 separate from a further interface used to receive the payload data. According to further implementations, the data clock signal 115 may be received by means of the data bus itself so that, in further implementations, the data communication input interface 110 may also be configured to receive payload data from the data bus.

The radar device 100 further comprises an analog-to-digital converter (ADC) 120. The analog-to-digital converter 120 is configured to sample a signal at time instants given by a sampling clock signal 130. Depending on the particular implementation, the ADC 120 may sample the signal at a falling edge, at a rising edge, or at the falling and rising edges of the sampling clock signal 130. Within a radar device 100, the ADC 120 may, for example, sample a downconverted radar signal of a receiver of the radar device to provide digitized data which can be further processed to conclude on radar reflecting targets in the field of view of the radar device 100. In a continuous wave radar device, for example, the downconverted radar signal may be generated by down-mixing a radar signal received from a reflecting target with the radar signal presently sent by a transmitter of the radar device. The frequency of the downconverted radar signal evaluated may then be the difference between the frequency of the presently sent radar signal and the frequency of the received radar signal. The frequency of the downconverted radar signal can then be used to calculate the difference between the radar device and the reflecting target. Since the ADC 120 only needs to sample a downconverted radar signal having a frequency much lower than the absolute frequency of the sent or received radar signals, a sampling frequency of the ADC 120 may be significantly lower than a sampling frequency that would be required to sample the sent or the received signals. The sampling frequency may be given by sampling clock signal 130.

The radar device 100 further comprises a sampling clock generation circuit 140 which is configured to generate the sampling clock signal 130 based on the data clock signal 115 received by means of the data communication input interface 110. Because an already available data clock signal 115 is used within the radar device 100 to determine the sampling clock signal for the ADC 120, additional input interfaces or input pins to receive the sampling clock signal 130 can be avoided. The lack of the requirement for additional input pins also results in a reduced effort when sequentially interconnecting multiple radar devices 100 to cooperatively receive and process radar signals. Further time aligned interconnects between the individual radar devices 100 are not necessary.

In some implementations, the sampling clock generation circuit 140 may comprise a frequency divider circuit 150 receiving the data clock signal 115. The frequency divider circuit 150 generates the sampling clock signal 130 with a frequency that is lower than the frequency of the data clock signal 115. For example, the frequency can be an integer fraction of the frequency of the data clock signal 115. Frequency divider circuit 150 may be implemented in an arbitrary manner. For example, for digital data clock signals 115, the frequency divider circuit 150 may comprise a counter. The counter can be set to count up to a number corresponding to the desired fraction of the frequency of the data clock signal 115 and then be reset to start counting from zero again. Upon every reset, an edge or a cycle of the sampling clock signal 130 may be generated resulting in a sampling clock signal 130 having a frequency which is an integer fraction of the frequency of the data clock signal 115, the fraction depending on the maximum counter value.

While the sampling clock signal is previously described to clock the ADC's within a radar device, further implementations may use the sampling clock signal as a base clock also for other purposes within the radar devices which necessitate synchronized processing. Further implementations may use the sampling clock signal also for purposes requiring a clock signal at the frequency of the sampling clock signal, even though synchronicity amongst the cooperating radar devices may not be of importance for the particular use.

Figure 2:
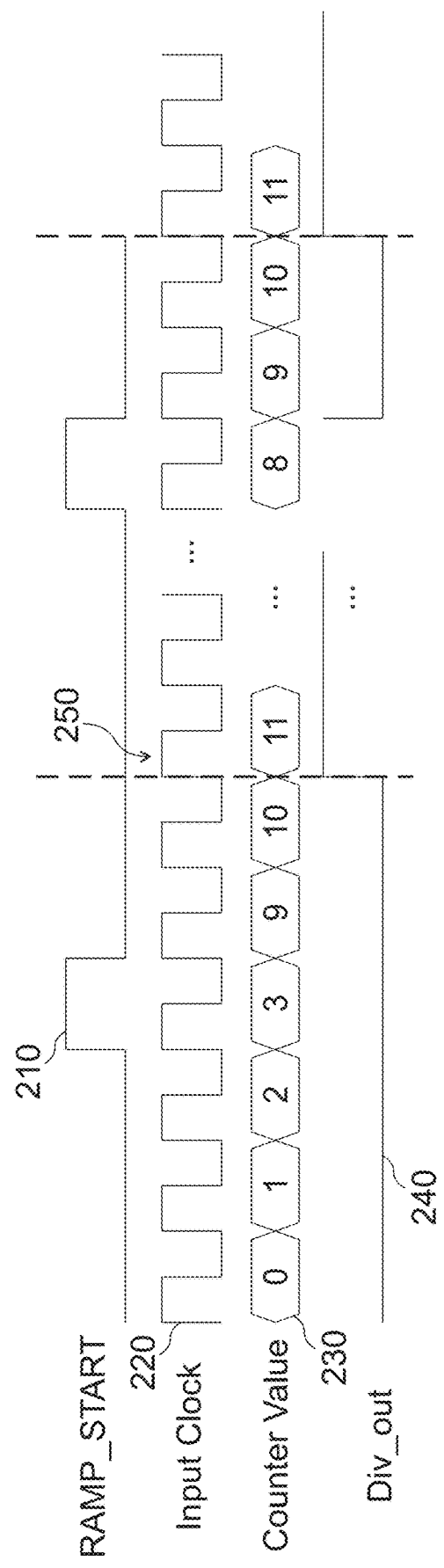
FIG. 2 illustrates a timing diagram for components within the radar device of FIG. 1.

FIG. 2 illustrates timing diagrams as to how the sampling clock generation circuit 140 may operate based on the previously described principles. According to the implementation illustrated in FIG. 2, the sampling clock generation circuit is further configured to modify a phase of the sampling clock signal 130 to achieve synchronicity of the sampling clock signals 130 of multiple cooperating radar devices 100. The synchronized generation of the sampling clock signal 130 is started upon receipt of a ramp start signal 210. The ramp start signal 210 may, for example, be received from another radar device. To achieve synchronized sampling clock signals 130 within all cooperating radar devices signal propagation times of the data clock signal 115 which occur until the data clock signal 115 is received by means of a radar device 100 need to be considered. Furthermore, also the ramp start signal 210 indicating the start of synchronized processing may exhibit a signal propagation delay until it is received by the radar device 100. Different signal propagation delays can be compensated within each radar device if the sampling clock generation circuit 140 is configured to not only reduce the frequency of the data clock signal 115 but to also modify the phase of the sampling clock signal 130. One particular example as to how this may be achieved as illustrated in FIG. 2.

FIG. 2 illustrates the data clock signal 220, the status of a counter 230 and the sampling clock signal 240 as generated by means of an implementation of a sampling clock generation circuit 140 which may be used in the implementation of FIG. 1.

In the example illustrated in FIG. 2, the sampling clock generation circuit generates a sampling clock signal 240 having a frequency of 1/12 of the frequency of the data clock signal 220. To achieve this, at every signal edge of the data clock signal 220 at which the counter value 230 would transit from 10 to 11, a positive signal edge of the sampling clock signal 240 is generated. The counter itself is clocked by the data clock signal 220 so that a rising signal edge of the sampling clock signal 240 is generated at every 12th rising signal edge of the data clock signal 220. Depending on the circumstances, the following falling edge of the sampling clock signal 240 may be generated after one or more cycle times of the data clock signal 220. The position of the falling edge may be arbitrary since a duty factor of 0.5 may not be of importance if the rising edge of the sampling clock signal 240 triggers the sampling of ADC 120. In further implementations, however the sampling of the ADC 120 may also be triggered by a falling edge of the sampling clock signal 240. Likewise, further implementations may also trigger at the falling edge of the ramp start signal 210 and/or the data clock signal 220.

In the implementation illustrated in FIG. 2, an appropriate phase shift to compensate for propagation delays of both, the ramp start signal 210 and the data clock signal 220 is implemented by pre-setting the counter to a predetermined value upon occurrence of the first ramp start signal 210. As illustrated, while the counter has a value of 3 before the falling edge of the ramp start signal 210, its value is set to 9 on occurrence of the following rising edge of the ramp start signal 210. That is, several values of the counter may be skipped on occurrence of ramp start signal 210 which effectively results in phase shifting the rising edge of the sampling clock signal 240 by increments of the cycle time of the data clock signal 220.

Presetting the counter value to an appropriate number on occurrence of the ramp start signal 210 allows to synchronize the sampling clock signal 240 to a predetermined cycle 250 of the sampling clock signal 240 rather than to the next cycle after the occurrence of the ramp start signal 210. In the particular example of FIG. 2, the sampling clock signal 240 is synchronized to the second cycle of the data clock signal 220 after the receipt of the ramp start signal 210. Generally speaking, the sampling clock generation circuit may be configured to determine the predetermined cycle to which the sampling clock signal is synchronized by selecting the n'th cycle of the data clock signal 220 after the receipt of the ramp start signal 210.

By appropriately defining the predetermined cycle of the data clock signal 220 to which the sampling clock signal 240 is synchronized, one may achieve to compensate for all signal propagation delays occurring until the ramp start signal 210 and/or the data clock signal 220 are received at the radar device 100. In the example illustrated in FIG. 2, this corresponds to the use of the appropriate predetermined counter value to be set upon occurrence of the ramp start signal 210 with in each of the collaborating receiver devices. The appropriate initial phase delay for each radar device can be determined in multiple different ways. For example, it may be a fixed value stored within each radar device 100 and pre-calculated for a particular set up of cooperating radar devices. The predetermined value may consider the individual propagation delays from a common signal source to each of the cooperating radar devices 100, irrespectively of the chosen signal distribution or data bus implementation. For example, if cooperating radar devices 100 are serially connected so that a data clock signal received by first radar device is internally forwarded to an output for the data clock signal to which a subsequence radar device is connected. In those circumstances, also propagation delays within the radar device occurring between the input and the output for the data clock signal can be considered. In a star-topology, the differences between the propagation delays occurring at each individual data line interconnecting the radar devices may be considered.

Further to pre-calculating or simulating the appropriate phase adjustments for each radar device within a given set up, one may also measure the individually required delays or phase adjustments for a given set up and store them in the radar devices. Further to storing the individual phase adjustments within the radar devices, the phase adjustments and associated counter values may also be transmitted to a radar device by means of, e.g., a data bus upon initialization. According to further implementations, the individual phase adjustments may also be determined during operation by means of a calibration algorithm using, for example, a reflecting target at a predetermined position.

According to further implementations, the sampling clock generation circuit may also be configured to modify the phase of the sampling clock signal depending on one or more environmental parameters. This may allow for stable and highly precise operation of a radar system although some environmental parameters which potentially influence the signal propagation delays vary during the operation of the radar device. For example, signal propagation delays caused by the forwarding of the data clock signal from an input to an output of a single radar device may be temperature dependent so that signal propagation delays of the data clock signal are temperature dependent for a subsequently connected radar device. If the sampling clock generation circuit is also capable to modify the phase of the sampling clock signal depending on temperature, the temperature dependency can be considered so that synchronized generation of the sampling clock signal can be maintained even at high temperature variations. As a further example, mechanical stress within a PCB or a substrate may also alter the signal propagation velocity so that the varying propagation delays may also be due to mechanical stress. If the mechanical stress is monitored, such signal propagation changes may also be compensated for, if the sampling clock generation circuit is capable to modify the phase based on the determined mechanical stress.

In summary and as illustrated in FIG. 2, radar systems may require that sampling time instances are identical and that a phase relation between clocks of multiple chips is constant. Dividing a clock (e.g. 625 MHz->50 MHz) provides an option to select multiple phases for the lower frequency clock. For example, RAMP_START may trigger or reset/preset a counter to a pre-defined value (e.g. '9'). This may set the correct phase and the corresponding chip or radar device is synchronized. A corrected phase may not be modified by following RAMP_START signals.

Figure 3:
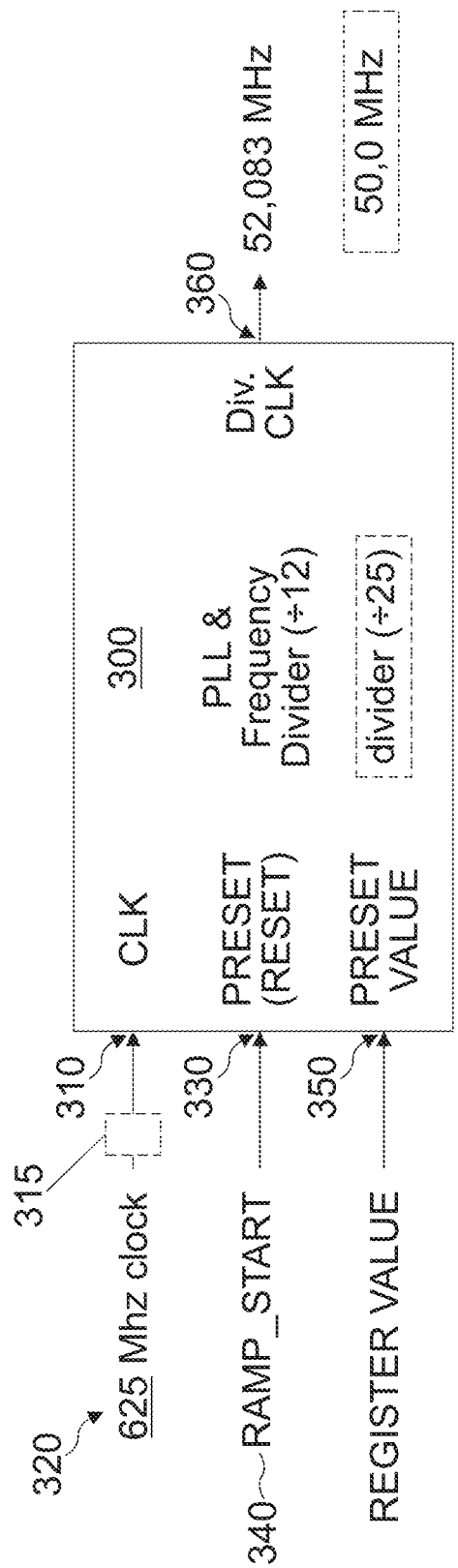
FIG. 3 illustrates an implementation of a sampling clock generation circuit.

FIG. 3 illustrates a block diagram of a frequency divider circuit 300 which may serve as sampling clock generation circuit and which is based on frequency divider circuitry using a Phase Lock Loop. The frequency divider circuit 300 has a clock signal input 310 to receive the data clock signal 320 which is chosen to be 625 MHz in this particular example. Further, the frequency divider circuit 300 comprises a preset input 330 to receive the ramp start signal 340 as well as a register value input 350 configured to receive the predetermined counter value resulting in the initial phase adjustment. In this particular example, the division factor is set to 12 so that the sampling clock signal 360 being output exhibits a frequency of 52,083 MHz. The frequency divider circuit 300 can be flexibly used within every radar device of a cooperating set since it is capable to use arbitrary initial phase adjustments depending the value provided at register value input 350.

In a further implementation, the frequency divider circuit 300 of FIG. 3 may optionally further comprise a frequency multiplier 315. In the implementation illustrated in FIG. 3, the multiplication factor is chosen to be 2 so that the frequency multiplier 315 doubles the frequency of the data clock signal to 1250 MHz. In the further implementation illustrated by means of broken lines in FIG. 3, the division factor is set to 25 resulting in a sampling clock signal 360 having a frequency of 50 MHz. In further implementations, the combination of the multiplication factor and the division factor may be chosen differently to result with a desired ratio between the frequency of the data clock signal 320 and the While the previously described sampling clock generation circuit is capable to modify a phase of the sampling clock signal in fractions of integer multiples of the cycle time of the data clock signal, further examples may include additional analog or digital delay circuitry capable to provide delays shorter than the cycle time of the data clock signal, resulting in increased time resolution and, therefore, higher synchronicity between different radar devices. The further delay circuitry may be implemented in an arbitrary manner, for example by means of analog delay lines where the length of the delay line determines the additionally introduced delay. In a digital implementation, the delay circuitry may, for example, comprise a series of sequentially connected flip-flops or registers, each flip-flop causing an additional delay so that an overall delay can be adjusted by choosing the flip-flop from which the output signal is taken. The appropriate flip flop may, for example, be chosen using a multiplexer connected to the output of the flip flops.

According to the examples using a frequency divider circuit or another circuit configured to reduce the frequency of the data clock signal to generate the sampling clock signal, the frequency of the data clock signal is higher than the frequency of the sampling clock signal to be generated. For example, the frequency of the data clock signal may be at least twice the frequency of the desired sampling clock signal in order to use a frequency divider circuit. According to further implementations, the frequency of the data clock signal may be by several factors higher than the frequency of the sampling clock signal, e.g. by a factor of three, four, five, six, or by an arbitrary higher number. The data clock signal may exhibit a high frequency, depending on the data bus technology to which the data clock signal refers. For example, some implementations may operate on data clock signals having a frequency of 625 MHz for a data bus using serial data transmission according to a specific Serializer/Deserializer (SerDes) protocol or according to the Serial Gigabit Media Independent Interface Ethernet protocol (SGMII). Other implementations may likewise use parallel data transmission protocols and arbitrary other frequencies.

In summary, the implementation of FIG. 3 proposes to use a PLL to generate the lower frequency of the sampling clock signal, which is reset/preset by the RAMP_START signal. A digital signal processor (DSP) provides a command to delay/advance the low-frequency clock by a certain number of phase steps. Further, a delay line with an inverter chain and multiplexer to select the desired delay may optionally be used, which could give even better timing resolution (Calibration of a delay chain to a desired unit delay is a common procedure).

Figure 4:
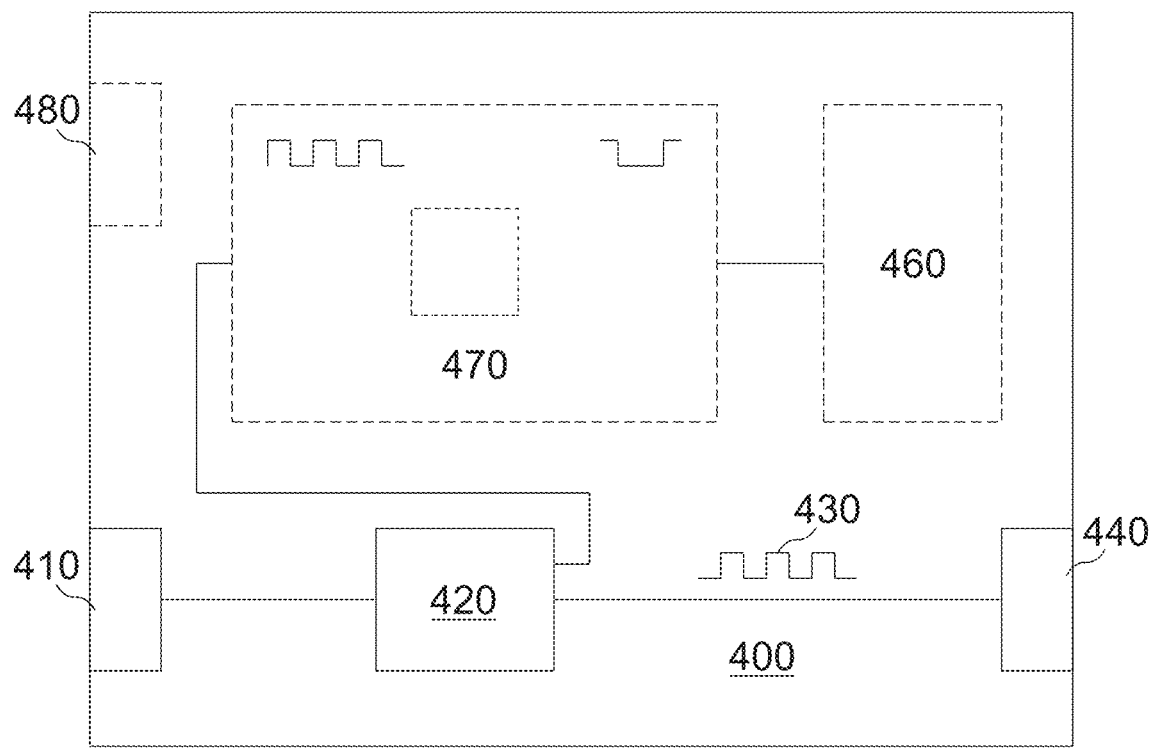
FIG. 4 illustrates an implementation of a radar device capable to generate a data clock signal.

FIG. 4 illustrates an example of a radar device 400 capable to generate a data clock signal. In order to be able to cooperate with further radar devices, implementations of radar devices 400 provide the capability to generate a data clock signal 430 with sufficient accuracy required within the system to allow for synchronous data sampling to, e.g., operate receive antennas of collaborating radar devices as a phased array. The radar device 400 of FIG. 4 comprises an oscillator interface 410 configured to receive an oscillator signal and a data clock generation circuit 420 configured to generate a data clock signal 430 for a data bus based on the oscillator signal. Stable and highly precise oscillators can be coupled to the oscillator interface 410 which then generates the time basis for the system. From the oscillator signal, the data clock signal 430 is generated which is used for the operation of the data bus and output on the data communication output interface 440. In further implementations, the oscillator signal may also be generated within the radar device, e.g. using a Linear electronic oscillator circuit such as a RC oscillator.

While the operation of the data bus itself may be feasible using also an alternative clock signal with a lower accuracy, deriving the data clock signal 430 from the highly accurate oscillator signal of an external oscillator may provide a stable data clock signal 430 with only little jitter which can additionally serve as a time basis for synchronized processing of multiple radar devices. The data clock signal 430 as output by means of the data communication output interface 440 can be distributed to multiple other radar devices where it serves to derive the sampling clock signal for each radar device as elaborated on before. While in some implementations, the radar device 400 of FIG. 4 may only serve to generate the data clock signal 430, further implementations may only also use radar device 400 as part of the cooperating radar system so that also radar device 400 receives and processes radar signals as part of the system.

An implementation that serves for both purposes generating the data clock signal 430 and processing radar signals may, therefore, additionally comprise an analog-to-digital converter 460 which is configured to sample a signal at a time instance given by a sampling clock signal. The sampling clock signal is derived from the data clock signal 430 generated within the radar device 400 itself. Therefore, the radar device 400 may furthermore comprise a sampling clock generator 470 which may correspond to the sampling clock generation circuit 140 of the radar device 100 of FIG. 1.

According to another implementation, radar device 400 may be further implemented to serve both purposes, generating the data clock signal 430 and distributing it to subsequent or further radar devices (as a master), or serving as a subsequent device capable to receive and process the data clock signal 430 (as a client). To this end, radar device 400 may furthermore comprise a data communication input interface 480 configured to receive the data clock signal generated by another radar device. A radar device comprising a data communication input interface 480, a data communication output interface 440 as well as an oscillator interface 410 may be universally used within a radar system to either generate or use the data clock signal, depending on the configuration and on which of the interfaces are used. An example of a radar system having serially connected radar devices cooperating to process data is subsequently described with respect to FIG. 6.

Figures 2, 5:
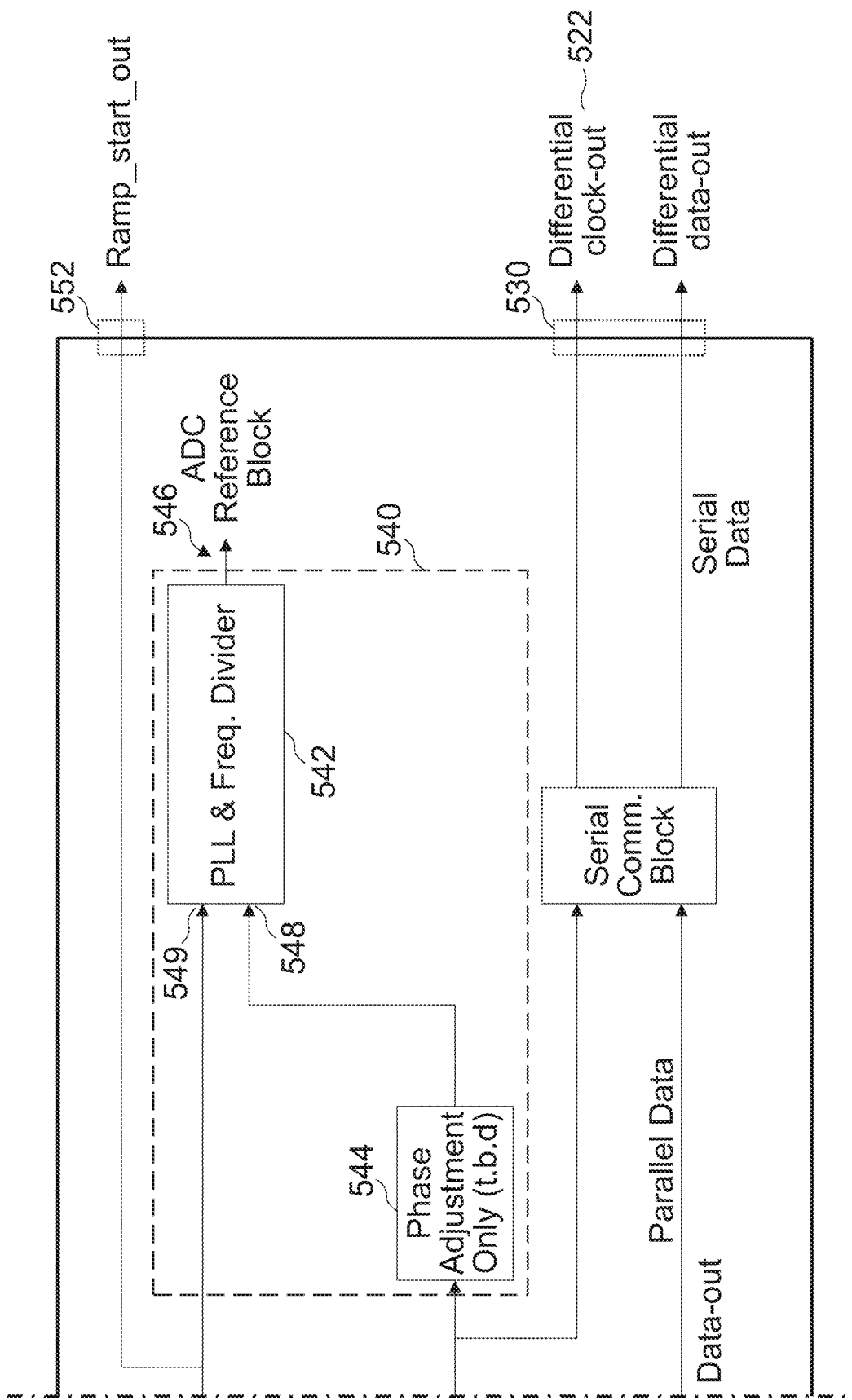
FIG. 5 (which is shown as comprising FIG. 5-1 and FIG. 5-2) illustrates select components of a further implementation of a radar device.

FIG. 5 illustrates a further implementation of a radar device 500 capable to serve as a generator for a data clock signal of a radar system (master) or as a user of the data clock signal (client). FIG. 5 is shown as including FIG. 5-1 (left portion) and FIG. 5-2 (right portion).

Radar device 500 comprises an oscillator interface 510, a data communication input interface 520 configured to receive the data clock signal, and a data communication output interface 530 configured to output the data clock signal. The purpose and use of oscillator interface 510, data communication input interface 520 and data communication output interface 530 has been elaborated on with respect to FIGS. 1 to 4 so that reference is herewith made to those considerations with respect to those elements.

Sampling clock generation circuit 540 comprises a frequency divider circuit 542 as well as further phase adjustment circuitry for 544. Frequency divider circuit 542 operates similar to frequency divider circuit 300 of FIG. 3 to generate sampling clock signal 546 by dividing the frequency of data clock signal provided at data clock signal input 548 of the frequency divider circuit 542. Frequency divider circuit 542 further comprises a ramp start input 549 to initiate synchronized generation of the sampling clock signal 546. Further phase adjustment circuitry 544 receives data clock signal as an input and is configured to implement a variable further delay smaller than a full cycle time of the data clock signal in order to further enhance the phase resolution of the sampling clock signal 546. In an alternative implementation, further phase adjustment circuitry 544 may also be coupled to an output of frequency divider circuit 542 for the same purpose. Data clock generation circuit 512 is connected to oscillator interface 510 to receive an oscillator signal and to generate data clock signal based on the oscillator signal.

Ramp start signal input 550 is configured to receive the ramp start signal, while ramp start signal output 552 is configured to output ramp start signal after the signal has propagated through radar device 500. By enabling the ramp start signal and the data clock signal to propagate through radar device 500, multiple radar devices 500 may be used in a serially connected manner to form multiple cooperating radar devices whose antennae are operated as a phased array and who furthermore allow distributed processing of the received radar signals.

To process the radar signals received by each radar device within the radar device itself, radar device 500 furthermore comprises a data processing unit 560. The data processing unit may, for example, be a microcontroller, an ASIC, an FPGA or the like. According to some implementations, the data processing unit 560 receives the signal as sampled by means of an analog-to-digital converter which is clocked by the sampling clock signal 546. In the event of a continuous wave radar, the data processed by data processing unit 560 may be digital samples of an intermediate frequency signal generated from received radar reflections in a continuous wave radar set up. In order to reduce computational load for subsequent devices evaluating radar information and in order to reduce the amount of data to be submitted from radar device 500 to subsequent processing entities, data processing unit may perform some preprocessing of the sampled intermediate frequency signal in order to provide radar data having information on the reflecting objects in a more compact representation. An example for such preprocessing may be the generation of radio data cubes.

In order to allow for distributed processing of the radar data, the radar device 500 of FIG. 5 further supports data communication by means of a data bus. To this end, data communication input interface 520 is further configured to receive payload data via a data bus, while data communication output interface 530 is configured to submit payload data via a data bus. In the particular example of FIG. 5, the data clock signal is received from and transmitted via the data bus, while further implementations may use dedicated clock signal lines for the same purpose.

The implementation of FIG. 5 further comprises a first multiplexer 572 as well as a second multiplexer 574. The use of multiplexers 572 and 574 together with the signal processing elements connected to oscillator interface 510 and ramp start signal input 550 determine, whether radar device 500 operates to generate the data clock signal 522 (as a master) or whether it uses the data clock signal 522 as provided at data communication input interface 520 (operating as a slave).

In the event that radar device 500 operates as master, a crystal oscillator is connected to oscillator interface 510 and first multiplexer 572 is configured to connect data clock generation circuit 512 to the input of sampling clock generation circuit 540. In order to be able to also provide the generated data clock signal to subsequent radar devices, the output of multiplexer 572 is further connected to the data communication output interface 530. Further, if the radar device 500 operates as a master, the start of synchronized operation may be caused by a microcontroller, which is providing an appropriate start signal at ramp start signal input 550. In this event, the second multiplexer 574 couples the output of ramp signal generation circuit 580 to sampling clock generation circuit 540 as well as to ramp start signal output 552. Upon reception of a start signal from the microcontroller, ramp signal generation circuit 580 generates a ramp start signal which is propagated to further radar devices by means of ramp start signal output 552 as well as to sampling clock generation circuit 540 where it is used to cause the generation of the sampling clock signal 546.

In the event radar device 500 operates as client, no oscillator circuit is required to be connected to oscillator interface 510. Instead, first multiplexer 572 couples data communication input interface 520 and sampling clock generation circuit 540 to enable sampling clock generation circuit 540 to use the received data clock signal to generate sampling clock signal 546. Also, second multiplexer 574 is configured to bypass ramp signal generation circuit 580 and to forward the ramp start signal as received by ramp start signal input 550 to sampling clock generation circuit 540 and ramp start signal output 552.

To the extent a clock signal is required when the radar device is switched on, an internal oscillator circuit 516 may be used to serve as an interim source for a clock signal until data clock signal and/or sampling clock signal are available to serve for the same purpose.

Figure 6:
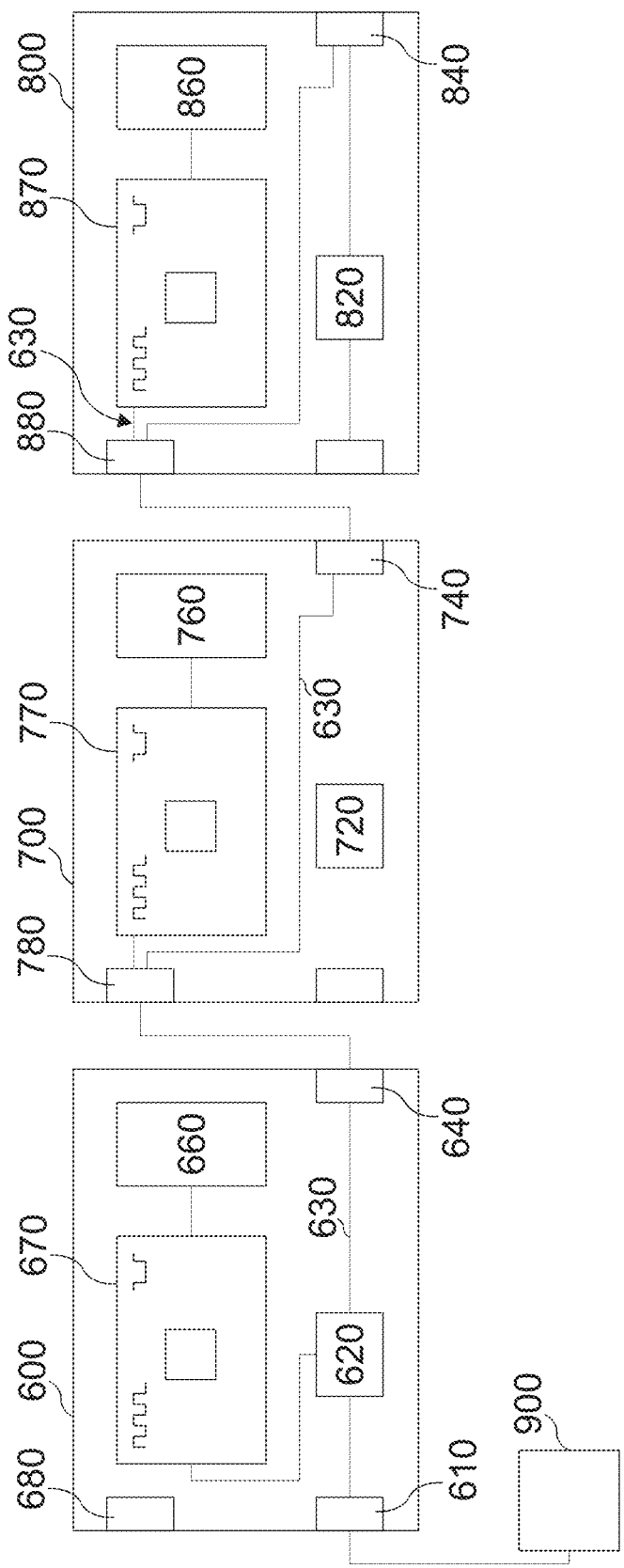
FIG. 6 illustrates an implementation of a radar system.

FIG. 6 illustrates an example of a radar system composed of three cooperating radar devices 600, 700 and 800 which are serially connected. Radar device 600 operates as a master, while radar devices 700 and 800 operate as slaves (in client mode). An oscillator circuit 900 is coupled to the oscillator interface 610 of radar device 600 to provide a precise time base for the generation of a data clock signal. Each of the radar devices 600, 700 and 800 comprises data communication input interfaces 680, 780 and 880, respectively. Like the implementation illustrated in FIG. 4, each of the radar devices further comprises sampling clock generation circuits 670, 770, 870, analog-to-digital converters 660, 760, 860, data clock generation circuits 620, 720, 820, and data communication output interfaces 640, 740, 840, respectively.

The oscillator interface 610 of the radar device 600 receives an oscillator signal and data clock generation circuit 620 of radar device 600 generates the data clock signal for all radar devices 600, 700, and 800. In the implementation illustrated in FIG. 6, data clock signal as well as payload data is transported by means of a data bus interconnecting the data communication output interface of a radar device with the data communication input interface of the succeeding radar device. Since data clock signal 630 generated by first radar device 600 is used by subsequent radar devices 700 and 800 operating as clients, data communication input interface 780 of radar device 700 receives data clock signal 630 and forwards it to sampling clock generation circuit 770 which generates the sampling clock signal for ADC 760 based on the data clock signal 630.

Further, data clock signal 630 is forwarded to data communication output interface 740 of radar device 700 to propagate data clock signal 630 to data communication input interface 880 of the third radar device 800 where it is used by sampling clock generation circuit 870 to generate the sampling clock signal for ADC 860. The signal propagation delays occurring between the first radar device 600 and the second radar device 700 are compensated by a proper phase adjustment within sampling clock generation circuit 770 as elaborated on before. Likewise, the signal propagation delay to radar device 800, which is due to the data bus between the first radar device 600 and the second radar device 700, the subsequent propagation delay within radar device 700 and the subsequent data bus between the second radar device 700 and they third radar device 800 is compensated by a modification of the phase of the sampling clock signal within sampling clock generation circuit 870.

In the example illustrated in FIG. 6, synchronicity between of the sampling clock signals of each of the radar devices 600, 700 and 800 is achieved using the data clock signal available due to the data bus connecting radar device 600 and radar device 700 as well as radar device 700 and radar device 800. Therefore, additional data lines and clock generation circuitry which would conventionally be used to distribute a separate sampling clock signals to the analog to digital converters of the individual radar devices can be saved.

According to an implementation, the radar devices 600, 700 and 800 are mounted on a common printed circuit board. Such a radar system may be designed with high flexibility since synchronicity of the sampling clock signals of the individual ADCs within the cooperating radar devices is achieved by means of the data clock signal of the data bus and hence complex routing requirements for a dedicated distribution of a sampling clock signal (which may, for example, require the individual lines to be of equal length) is not necessary. While some implementations may use dedicated data wires to transport the data clock signal for the data bus, further implementations may also use a protocol where the data clock signal is intrinsically encoded with in the payload data signal transmitted via the data bus so that it can be reconstructed within the data communication input interfaces.

While the implementation illustrated in FIG. 5 uses an additional input and output interface to distribute the ramp start signal causing the start of synchronized processing, further implementations may also use the data bus to propagate the ramp start signal.

The implementation illustrated in FIG. 6 may further allow for distributed processing of radar data received by means of all antennas of the cooperating radar devices as a phased array. For example, each of the radar devices 600, 700, and 800 may preprocess the radar signals received by means of the antennas within each of the radar devices. In a particular example, each of the radar devices may generate radar data cubes based on the signals received by the receive antennas and forward the generated radar data cubes to the subsequent radar device by means of the data bus. The data communication output interface 840 of the last radar device 800 of the series may then be connected to a microprocessor or an Electrical Control Unit (ECU) of a vehicle which processes the data of the 3 radar devices 600, 700, and 800 further to identify radar reflecting targets in the field of view of the radar system.

If multiple radar devices which are principally capable to measure radar data alone are joined to form a radar system as illustrated in FIG. 6, each of the radar devices may further comprise a radar transmitter which starts transmitting a radar signal (e.g. a radar signal with a linearly rising and/or falling frequency) upon receipt of the ramp start signal. If multiple radar devices are joined to operate as illustrated in FIG. 6, only the transmitter of one select radar device may be used during a measurement. Depending on the circumstances, however, also multiple or all transmitters of the cooperating radar devices may be used while synchronicity of the transmitters is guaranteed similarly to the mechanism guaranteeing synchronicity of the sampling clock signals.

Figure 7:
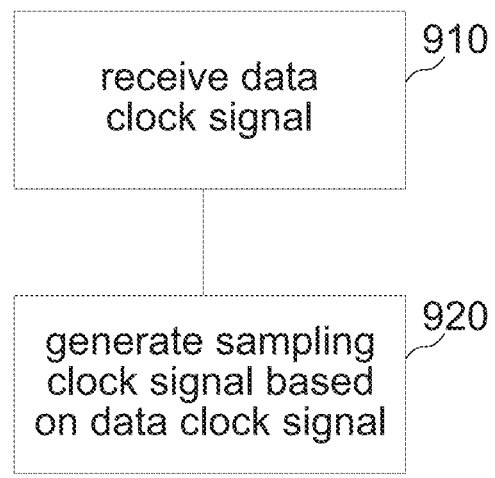
FIG. 7 illustrates a flowchart of an implementation of a method for generating a sampling clock signal.

FIG. 7 illustrates an example of a method for generating a sampling clock signal within a radar device as, for example, illustrated in the preceding figures. The method comprises receiving a data clock signal 910 as well as generating the sampling clock signal based on the data clock signal 920. According to some implementations, generating the sampling clock signal may comprise dividing a frequency of the data clock signal.

Figure 8:
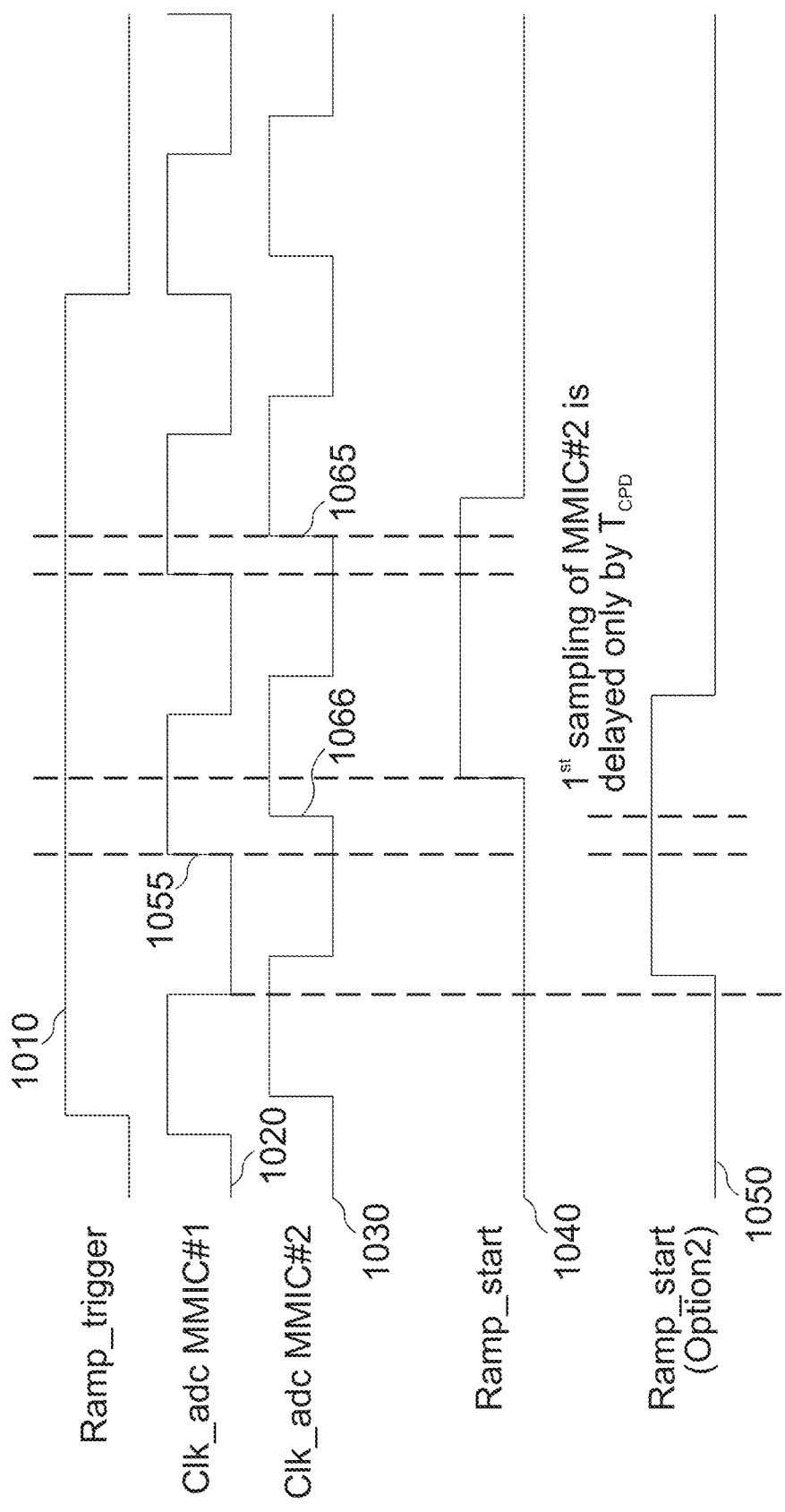
FIG. 8 illustrates two different options to trigger the generation of a sampling clock signal.

FIG. 8 illustrates two different options to trigger the generation of a sampling clock signal. The top graph illustrates a ramp trigger signal 1010 as it may, for example, be issued by a microprocessor (MCU) to start data taking by means of a radar system as, for example, illustrated in FIG. 6. The ramp trigger signal 1010 is received by the first radar device and causes it to generate the ramp start signal for subsequent radar devices. First sampling clock signal 1020 of the first radar device and second sampling clock signal 1030 of the second radar device subsequent to the first radar device is further illustrated in FIG. 8. As illustrated in FIG. 8, the first ramp start signal 1040 is generated upon occurrence of the first positive signal edge 1055 of the first sampling clock signal 1020 after the ramp trigger signal 1010 is positive. This results in the first sampling of the ADC in the second radar device on the positive signal edge 1065 of the second sampling clock signal 1030. If, however, ramp start signal 1050 is generated on occurrence of the falling edge of the first sampling clock signal 1020, the first sampling of the ADC of the second radar device already occurs on the preceding positive signal edge 1066 of the second sampling clock signal 1030.

Choosing to generate the second ramp start signal 1050 upon occurrence of the negative signal edge of the first sampling clock signal 1020 of the master radar device may, therefore, reduce the delay until the second, subsequent radar device starts sampling by 50% or by one half of the clock period.

In summary, the implementations described herein use a clock already assigned for data communication between radar devices (MMICs) as ADC-clock and define associated mechanisms to allow fine synchronization between MMICs. The fine synchronization or phase adjustment considers internal clock propagation from cascade in to cascade out of each clock slave MMIC. Each MMIC has an internal clock delay configuration so that it can select or operate using its own delay. According to some implementations, a higher frequency differential clock source is used as a source for an ADC clock from the system module. For example, an SGMII Ethernet clock (e.g. 625 MHz for 1 Gbps) or a SerDes clock (e.g. 625 MHz) may be used. SerDes or SGMII Ethernet may be present in the system for data communication. ADC clock may be slower than the clock for communication and ADC clock is generated by dividing the faster clock. ADC phase control may be generated using analog delay lines for delays smaller than 1 clock period and digital counters for delays longer than 1 clock period. Phase delay between MMIC may be for example compensated by using a predefined value at each MMIC at start-up. This value could then be fixed or being changed according to environmental parameters like supply voltage, temperature, or the like. Alternatively or additionally, a computed delay during run time can be used which may be computed in another ECU. Alternatively, it may be computed in the Radar, by each MMIC (radar device) or by any MMIC that would be assigned this task and would use the data communication between MMICs to pass the resulting delay to other MMICs.

Because MMICs are setting their own phase delay, one may call MMICs differently, distinguished by their different function. A clock-master-MMIC has the crystal oscillator and generates the reference clock. A clock-master-MMIC may be optionally also be able to adjust is phasing with respect to the communication clock (input or output). A Clock-slave-MMIC does not have a crystal oscillator. A Clock-slave-MMIC is able to adjust its phasing with respect to the input communication clock (data clock signal) and is propagating the input clock on the communication port.

The aspects and features mentioned and described together with one or more of the previously detailed examples and figures may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F) PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

Functions of various elements shown in the figures, including any functional blocks may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A radar device, comprising:
a data communication input interface configured to:
receive a data clock signal for a data bus;
an analog to digital converter configured to:
sample a signal at time instants given by a synchronized sampling clock signal; and
a sampling clock generation circuit configured to:
perform synchronization of a sampling clock signal to a predetermined cycle of the data clock signal, and generate the synchronized sampling clock signal based on performing the synchronization.

2. The radar device of claim 1, wherein the sampling clock generation circuit comprises a frequency divider circuit configured to:
reduce a frequency of the data clock signal to generate the synchronized sampling clock signal.

3. The radar device of claim 1, wherein the sampling clock generation circuit is further configured to:
modify a phase of the sampling clock signal.

4. The radar device of claim 3, wherein the sampling clock generation circuit, when modifying the phase of the sampling clock signal, is to:
modify the phase based on at least one environmental parameter.

5. The radar device of claim 1, wherein the sampling clock generation circuit, when performing the synchronization of the sampling clock signal, is configured to:
perform the synchronization of the sampling clock signal based on receiving a ramp start signal.

6. The radar device of claim 1, wherein the sampling clock generation circuit is further configured to:
determine the predetermined cycle of the data clock signal by selecting the predetermined cycle of the data clock signal based on receiving a ramp start signal.

7. The radar device of claim 1, wherein the analog to digital converter, when sampling the signal at the time instants given by the synchronized sampling clock signal, is configured to:
sample a downconverted radar signal of a receiver of the radar device.

8. The radar device of claim 7, further comprising one or more of:
a mixer circuit configured to down-mix a radar signal with a local oscillator signal to generate the downconverted radar signal,
a receive antenna coupled to the mixer circuit and configured to receive the radar signal, or
a low noise amplifier coupled between the receive antenna and the mixer circuit.

9. The radar device of claim 1, wherein the data communication input interface is further configured to:
receive payload data via the data bus.

10. The radar device of claim 1, wherein the data communication input interface is configured to:
receive the data clock signal via the data bus.

11. The radar device of claim 1, wherein the sampling clock generation circuit is further configured to:
generate a frequency of the synchronized sampling clock signal using a phase locked loop (PLL).

12. A radar device, comprising:
an oscillator interface configured to:
receive an oscillator signal generated by an external oscillator;
a data clock generation circuit configured to:
generate a data clock signal for a data bus based on the oscillator signal;

a data communication output interface configured to:
  output the data clock signal; and
a sampling clock generation circuit configured to:
  perform synchronization of a sampling clock signal to a predetermined cycle of the data clock signal, and
  generate a synchronized sampling clock signal based on performing the synchronization.

13. The radar device of claim 12, wherein the data communication output interface is further configured to:
output payload data.

14. The radar device of claim 12, further comprising:
an analog to digital converter configured to:
  sample a signal at time instants given by the synchronized sampling clock signal.

15. The radar device of claim 12, further comprising:
an input interface configured to receive another data clock signal; and
wherein the sampling clock generation circuit is further configured to:
  perform synchronization of another sampling clock based on the other data clock signal.

16. A radar system comprising:
a first radar device, comprising:
  an oscillator interface configured to:
    receive an oscillator signal;
  a data clock generation circuit configured to:
    generate a data clock signal for a data bus based on the oscillator signal; and
  a data communication output interface configured to:
    output the data clock signal;
a second radar device, comprising:
  a data communication input interface configured to:
    receive the data clock signal;
  an analog to digital converter configured to:
    sample a signal according to a synchronized sampling clock signal; and
  a sampling clock generation circuit configured to:
    perform synchronization of a sampling clock signal to a predetermined cycle of the data clock signal, and
    generate the synchronized sampling clock signal based on performing the synchronization; and
the data bus connecting the data communication output interface and the data communication input interface.

17. The radar system of claim 16, further comprising:
an oscillator circuit coupled to the oscillator interface of the first radar device, the oscillator circuit being configured to generate the oscillator signal.

18. The radar system of claim 16, further comprising:
a common printed circuit board on which the first radar device and the second radar device are mounted.

19. The radar system of claim 16, further comprising:
a third radar device, comprising:
  a data communication input interface configured to:
    receive the data clock signal from the second radar device;
  an analog to digital converter configured to:
    sample another signal according to another synchronized sampling clock signal; and
  a sampling clock generation circuit configured to:
    generate the other synchronized sampling clock signal based on the data clock signal.

20. The radar system of claim 16, further comprising:
a third radar device, comprising:
  a data communication input interface configured to:
    receive the data clock signal from the first radar device;
  an analog to digital converter configured to:
    sample another signal according to another synchronized sampling clock signal; and
  a sampling clock generation circuit configured to:
    generate the other synchronized sampling clock signal based on the data clock signal.

* * * * *